United States Patent [19]
Harford

[11] Patent Number: 5,898,347
[45] Date of Patent: *Apr. 27, 1999

[54] LARGE SIGNAL ATTENUATOR

[75] Inventor: J. Rudy Harford, Flemington, N.J.

[73] Assignee: Elcom Technologies Corporation, King of Prussia

[*] Notice: This patent issued on a continued prosecution application filed under 37 CFR 1.53(d), and is subject to the twenty year patent term provisions of 35 U.S.C. 154(a)(2).

[21] Appl. No.: 08/764,854

[22] Filed: Dec. 13, 1996

Related U.S. Application Data

[XX .
[60] Provisional application No. 60/008,894, Dec. 19, 1995.

[51] Int. Cl.$^6$ .................................................. H03H 7/24
[52] U.S. Cl. .......................... 333/17.1; 327/331; 327/332; 330/134
[58] Field of Search .................... 333/17.1, 17.2, 333/81 R; 327/308, 323, 331, 332; 323/265; 330/133, 134, 279

[56] References Cited

U.S. PATENT DOCUMENTS

| 3,003,115 | 10/1961 | Stull, Jr. | 330/133 |
| 3,319,176 | 5/1967 | Guisinger | 327/332 X |
| 4,376,267 | 3/1983 | Chu et al. | 330/284 |
| 4,500,845 | 2/1985 | Ehni | 333/81 R X |
| 5,049,841 | 9/1991 | Cooper et al. | 333/81 R |
| 5,432,473 | 7/1995 | Mattila et al. | 330/133 |
| 5,448,207 | 9/1995 | Kohama | 333/81 R |

FOREIGN PATENT DOCUMENTS

| 92 15 735 | 3/1993 | Germany. | |
| 54-100644 | 8/1979 | Japan | 330/133 |

*Primary Examiner*—Paul Gensler
*Attorney, Agent, or Firm*—Ratner & Prestia

[57] ABSTRACT

An attenuator circuit having three cascaded attenuator stages which become active, one at a time, as an input signal strength increases. In the highest gain state, the three attenuator stages are active. As the input signal increases, the attenuator stages become inactive sequentially starting with the last stage.

3 Claims, 1 Drawing Sheet

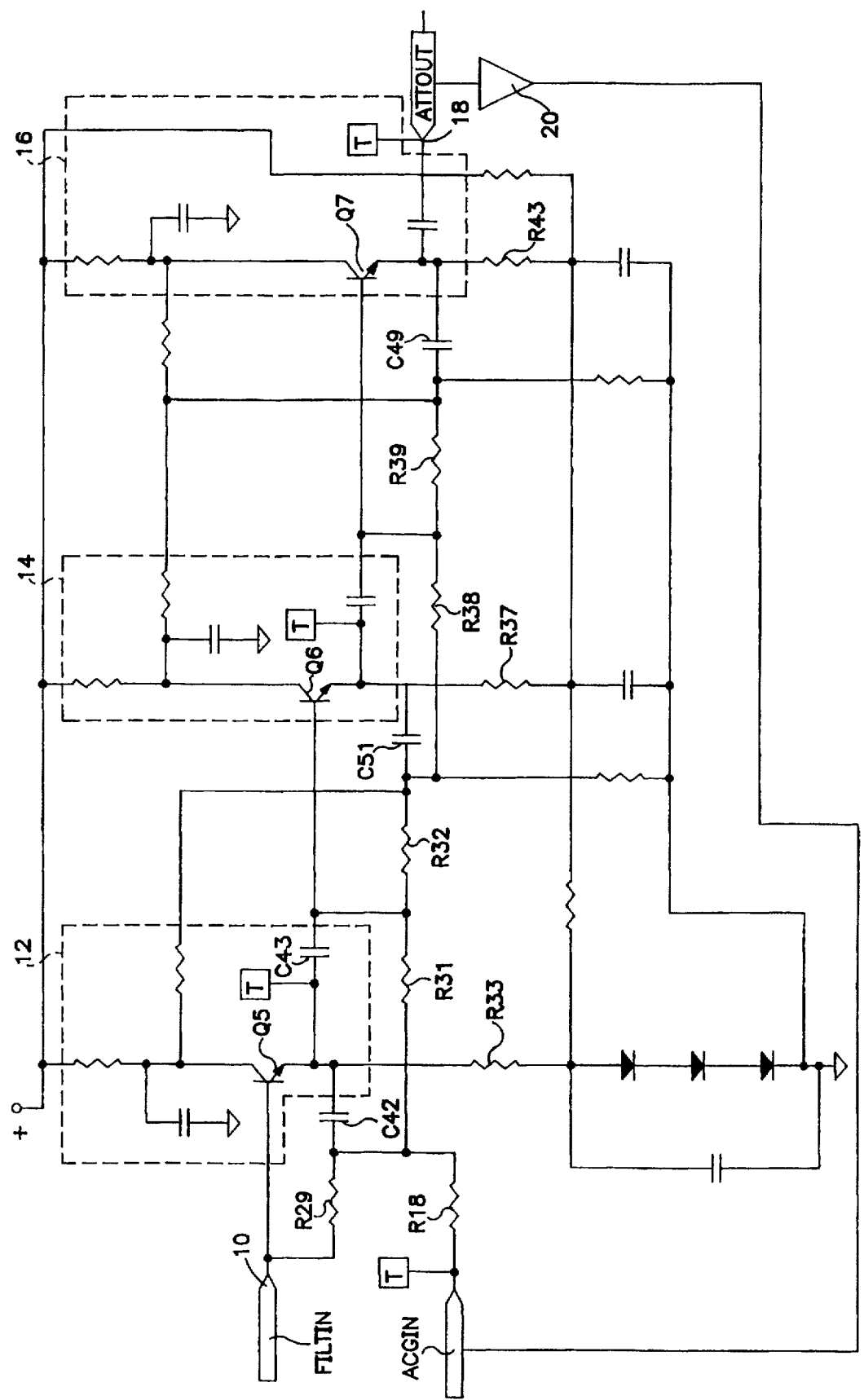

LARGE SIGNAL ATTENUATOR

This application claims the benefit of U.S.Provisional Application No. 60/008,894 filed Dec. 19, 1995.

FIELD OF THE INVENTION

This invention relates to an attenuation circuit for the processing of signals, and more particularly to a circuit for attenuating large signals without distorting the signals during propagation and which has loss insertion loss in the presence of weak signals.

BACKGROUND OF THE INVENTION

Amplitude linearity must be preserved in amplitude modulated video signals, such as NTSC television signals, to offer pleasing picture quality. When NTSC television signals are amplitude modulated onto a carrier and transmitted over a power line, it is desirable to transmit the carrier at relatively high levels (i.e. signal voltages) to overcome the ambient noise level and high propagation losses due to impedance mismatching at the transmitted frequencies. These impedance mismatches can lead not only to signal power losses but also to actual voltage rises due to impedance transformation on the power line.

SUMMARY OF THE INVENTION

A signal attenuator, constructed in accordance with the present invention, includes means for supplying an input signal, a first attenuator stage for attenuating the input signal when the first attenuator stage is active to develop a first attenuated signal, a second attenuator stage for attenuating the first attenuated signal when the second attenuator stage is active to develop a second attenuated signal, and a third attenuator stage for attenuating the second attenuated signal when the third attenuator stage is active to develop a third attenuated signal. This signal attenuator also includes an output terminal and means for conducting to the output terminal: (a) the third attenuated signal when the first attenuator stage, the second attenuator stage, and the third attenuator stage are active, (b) the second attenuated signal when the first attenuator stage and the second attenuator stage are active and the third attenuator stage is inactive, (c) the first attenuated signal when the first attenuator stage is active and the second attenuator stage and the third attenuator stage are inactive, and (d) the input signal when the first attenuator stage, the second attenuator stage, and the third attenuator stage are inactive. This signal attenuator further includes means for conducting the signal at the output terminal to the first attenuator stage, the second attenuator stage, and the third attenuator stage to render inactive: (a) the third attenuator stage when the signal at the output terminal exceeds a first level, (b) the second attenuator stage when the signal at the output terminal - exceeds a second level greater than the first level, and (c) the first attenuator stage when the signal at the output terminal exceeds a third level greater than the second level.

BRIEF DESCRIPTION OF THE FIGURES

The single FIGURE is a circuit diagrarof an exemplary embodiment of the present invention.

DETAILED DESCRIPTION OF THE EXEMPLARY EMBODIMENTS

Referring to drawing, a signal attenuator, constructed in accordance with the present invention, includes an input line 10 along which an input signal FILTIN is supplied. Also included in this signal attenuator are a first attenuator stage 12 for attenuating the input signal when first attenuator stage 12 is active to develop a first attenuated signal, a second attenuator stage 14 for attenuating the first attenuated signal when second attenuator stage 14 is active to develop a second attenuated signal, and a third attenuator stage 16 for attenuating the second attenuated signal when third attenuator stage 16 is active to develop a third attenuated signal.

signal attenuator, constructed in accordance with the present invention, also has an output terminal 18 from which an output signal ATTOUT is delivered and means for conducting to output terminal 18:

(a) the third attenuated signal when the first attenuator stage 12, the second attenuator stage 14, and the third attenuator stage 16 are active, (b) the second attenuated signal when the first attenuator stage 12 and the second attenuator stage 14 are active and the third attenuator stage 16 is inactive, (c) the first attenuated signal when the first attenuator stage 12 is active and the second attenuator stage 14 and the third attenuator stage 16 are inactive, and (d) the input signal when the first attenuator stage 12, the second attenuator stage 14, and the third attenuator stage 16 are inactive.

A signal attenuator, constructed in accordance with the present invention, further includes means for conducting the output signal ATTOUT at output terminal 18 to first attenuator stage 12, second attenuator stage 14, and third attenuator stage 16 to render inactive:

(a) third attenuator stage 16 when the signal at output terminal 18 exceeds a first level, (b) second attenuator stage 14 when the signal at output terminal 18 exceeds a second level greater than the first level, and (c) first attenuator stage 12 when the signal at output terminal 18 exceeds a third level greater than the second level.

Such means include an automatic gain control detector 20 connected between output terminal 18 and an AGCIN input and a first resistive divider R29 and R33, a second resistive divider R32 and R37, and a third resistive divider R39 and R43 associated with first attenuator stage 12, second attenuator stage 14, and third attenuator stage 16, respectively.

The FILTIN input signal, for example a carrier signal modulated by a television signal from a power line, is supplied along input line 10 and ranges, for example, from 30 mV to 1.25 V. The ATTOUT output signal at output terminal 18, after amplification by AGC detector 20, is the AGCIN signal. The circuit is arranged so that the ATTOUT output signal at output terminal 18 remains at approximately 20 mV through the ranges of the FILTIN input signal and the AGCIN signal.

The AGCIN signal biases transistors (Q5, Q6 and Q7. The AGCIN signal is a signal which has been filtered by a lowpass filter in AGC detector 20. When the FILTIN input signal is low, the AGCCIN signal is high and transistor Q5, Q6 and (Q7 are active and the ATTOUT output signal is approximately 20 mV.

As the FILTIN input signal increases, the AGCIN signal from AGC detector 20 changes and, at some point, the resistive divider R39 and R43 causes transistor Q7 (and third attenuator stage 16) to becomes inactive, while transistors Q5 and Q6 (and first and second attenuator stages 12 and 14, respectively) remain active. This results in an approximately 12 dB loss. When transistor Q7 is inactive, the signal at the junction of resistors R38 and R39 passes through resistor R39, capacitor C49 and resistor R43 instead of passing through the base of transistor Q7.

As the FILTIN input signal increases further, the AGCIN signal from AGC detector 20 changes and, at some point, the resistive divider R32 and R37 causes transistor Q6 (and second attenuator stage 14) to become inactive, while transistor Q7 (and third attenuator stage 16) also is inactive and transistor Q5 (and first attenuator stage 12) remains active. This results in an approximately 12 dB loss. When transistor Q6 is inactive, the signal at the junction of resistors R31 and R32 passes through a first path composed of resistor R32, capacitor C52, and resistor R37 and a second path composed of resistor R32, resistor R38, resistor R39, capacitor C49 and resistor R43 instead of passing through the base of transistor Q6.

As the FILTIN input signal increases further, the AGCN signal from AGC detector 20 changes and, at some point, the resistive divider R29 and R33 causes transistor Q5 (and first attenuator stage 12) to become inactive, while transistors Q6 and Q7 (and second and third attenuator stages 14 and 16, respectively) also are inactive. This results in an approximately 12 dB loss. When transistor Q5 is inactive, the signal at the junction of resistors R29 and R48 passes through a first path composed of resistor R29, capacitor C42 and resistor R33, a second path composed of resistor R31, resistor R32, capacitor C51 and resistor R37, and a third path composed of resistor R39, capacitor C49 and resistor R43 instead of passing through the base of transistor Q5.

Thus, the circuit has three cascaded attenuator stages 12, 14 and 16 which become active, one at a time, as the FILTIN input signal strength increases. In the highest gain state, transistors (Q5, Q6 and Q7 are active and the insertion loss of the circuit is nominally 3 dB. As the FILTIN input signal increases and current is drawn from the AGCIN signal connection, transistors Q5, Q6 and Q7 become inactive sequentially starting with transistor Q7. The parameters are chosen so that each attenuator stage 12, 14 and 16 has an approximately 12 dB attenuation at full attenuation with the result that the overall attenuator circuit has a dynamic range of about 36 dB (i.e. 64 times attenuation). A signal of approximately 20 mV is maintained at output terminal 12. Therefore, the attenuator circuit can handle FILTIN input signals of approximately 1.28 V (20 mV×64=1280 mV). In the attenuation mode, transistors Q5, Q6 and Q7 are backbiased and the attenuation circuit has resistive dividers composed of the series resistors I 29, R32 and R39 working against the shunt resistors R33, R37 and R43, respectively.

Although illustrated and described herein with reference to a certain specific embodiment, the present invention is nevertheless not intended to be limited to the details shown. Rather, various modifications may be made in the details within the scope and range of equivalents of the claims and without departing from the spirit of the invention.

What is claimed:

1. A signal attenuator comprising:

means for supplying an input signal;

a first attenuator stage for attenuating said input signal when said first attenuator stage is active to develop a first attenuated signal;

a second attenuator stage for attenuating said first attenuated signal when said second attenuator stage is active to develop a second attenuated signal;

a third attenuator stage for attenuating said second attenuated signal when said third attenuator stage is active to develop a third attenuated signal;

an output terminal;

means for conducting to said output terminal:
   (a) said third attenuated signal when said first attenuator stage, said second attenuator stage, and said third attenuator stage are active,
   (b) said second attenuated signal when said first attenuator stage and said second attenuator stage are active and said third attenuator stage is inactive,
   (c) said first attenuated signal when said first attenuator stage is active and said second attenuator stage and said third attenuator stage are inactive, and
   (d) said input signal when said first attenuator stage, said second attenuator stage, and said third attenuator stage are inactive; and means for conducting the signal at said output terminal to said first attenuator stage, said second attenuator stage, and said Bird attenuator stage to render inactive:
   (a) said third attenuator stage when the signal at said output terminal exceeds a first level,
   (b) said second attenuator stage when the signal at said output terminal exceeds a second level greater than said first level, and
   (c) said first attenuator stage when the signal at said output terminal exceeds a third level greater than said second level.

2. A signal attenuator according to claim 1 wherein said means for conducting the output signal to:

(a) said first attenuator stage to render inactive said first attenuator stage include a first resistive divider associated with said first attenuator stage and an automatic gain control detector disposed between said output terminal and said first resistive divider, (b) said second attenuator stage to render inactive said second attenuator stage include a second resistive divider associated with said second attenuator stage and said automatic gain control detector disposed between said output terminal and said second resistive divider, and (c) said third attenuator stage to render inactive said third attenuator stage include a third resistive divider associated with said third attenuator stage and said automatic gain control detector disposed between said output terminal and said third resistive divider.

3. A signal attenuator according to claim 2 wherein:

(a) said third resistive divider renders said third attenuator stage inactive when the signal at said output terminal exceeds said first level, (b) said second resistive divider renders said second attenuator stage inactive when the signal at said output terminal exceeds said second level, and (c) said first resistive divider renders said first attenuator stage inactive when the signal at said output terminal exceeds said third level.

* * * * *